United States Patent [19]

Kinoshita et al.

[11] Patent Number: 4,736,426
[45] Date of Patent: Apr. 5, 1988

[54] GRAPHIC BALANCER

[75] Inventors: Tsutomu Kinoshita, Tokyo; Masahiro Ohtsu, Kanagawa; Teruhisa Ide, Tokyo, all of Japan

[73] Assignee: Sony Corporation, Tokyo, Japan

[21] Appl. No.: 928,276

[22] PCT Filed: Feb. 17, 1986

[86] PCT No.: PCT/JP86/00070
§ 371 Date: Oct. 17, 1986
§ 102(e) Date: Oct. 17, 1986

[87] PCT Pub. No.: WO86/05059
PCT Pub. Date: Aug. 28, 1986

[30] Foreign Application Priority Data
Feb. 18, 1985 [JP] Japan .................. 60-29871

[51] Int. Cl.4 .................................. H04S 1/00
[52] U.S. Cl. .................................. 381/1; 381/98; 381/109
[58] Field of Search .................. 381/1, 98, 103, 104, 381/119, 109

[56] References Cited

U.S. PATENT DOCUMENTS

| 3,195,067 | 7/1965 | Klein et al. | 381/104 |
| 4,046,960 | 9/1977 | Veale | 381/103 |
| 4,577,540 | 3/1986 | Yamana | 381/1 |
| 4,612,665 | 9/1986 | Inami et al. | 381/98 |

FOREIGN PATENT DOCUMENTS

| 58-139600 | 8/1983 | Japan | 381/1 |
| 59-33400 | 3/1984 | Japan . | |

Primary Examiner—Forester W. Isen
Attorney, Agent, or Firm—Hill, Van Santen, Steadman & Simpson

[57] ABSTRACT

The present invention provides a graphic balancer comprising, in units of bands, level adjusting means (operational amplifiers 1L and 1R, resonators 2L and 2R, and volume controls 3L and 3R) for increasing a level of a sound signal of one of two stereo channels which are divided into a plurality of bands while synchronously decreasing a level of the other, so that localization of a sound image can be shifted in individual bands. As one embodiment of the present invention, a graphic balancer in which a graphic balancer and a graphic equalizer can be switched is disclosed.

2 Claims, 3 Drawing Sheets

GRAPHIC BALANCER

TECHNICAL FIELD

The present invention relates to a circuit for localization shift of a sound image and is optimum for use in a stereo system.

BACKGROUND ART

Normally, a graphic equalizer can adjust levels in each of a plurality of divided bands and set a frequency correction curve by some visible means. By using such a graphic equalizer, a sound image or a tone color of a musical instrument or the like which occupies a specific band can be changed. However, localization of the musical instrument can be shifted to some extent but smooth shift and shift operation with natural feeling cannot be obtained by the graphic equalizer.

DISCLOSURE OF THE INVENTION

The present invention has been made in consideration of the above problems, and has as its object to shift freely the sound image, distinctly in response to a shift operation with natural feeling.

A graphic balancer of the present invention has level adjusting means for increasing or decreasing signal levels of sound signals of two channels in individual bands. The level adjusting means of the two channels are synchronously operated in opposite directions, so that the levels can be increased at one channel and decreased at the other. Thus, levels of right and left channels can be balanced in individual bands.

BEST MODE OF CARRYING OUT THE INVENTION

Figure 4:
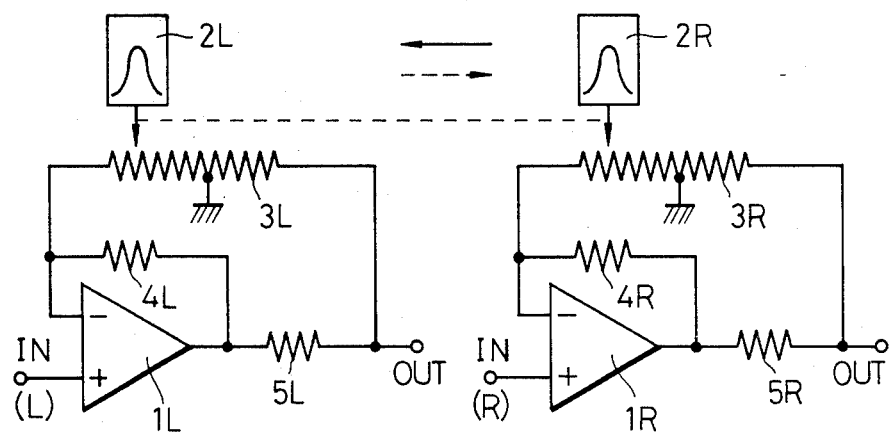
FIG. 4 is a basic circuit of a graphic equalizer.

Before describing the present invention, a basic circuit of a conventional graphic equalizer will be described below with reference to FIG. 4. A circuit shown in FIG. 4 is for one of a plurality of divided bands and has operational amplifiers 1L and 1R and resonators 2L and 2R for right and left channels. The resonators 2L and 2R are connected to movable terminals of volume controls 3L and 3R whose middle points are grounded. The volume controls 3L and 3R are connected between output terminals and negative feedback input terminals of the operational amplifiers 1L and 1R.

The right and left volume controls 3L and 3R are synchronized. When both of the movable terminals thereof are moved to the left in FIG. 4, levels of the negative feedback input terminals of the operational amplifiers 1L and 1R are decreased by the resonators 2L and 2R according to a voltage division ratio of negative feedback resistors 4L and 4R and the volume controls 3L and 3R, thereby increasing an output level of this band. When the movable terminals of the volume controls 3L and 3R are moved to the right in FIG. 4, the voltage division ration which is determined by output resistors 5L and 5R of the operational amplifiers 1L and 1R and by the volume controls 3L and 3R is varied by the resonators 2L and 2R, thereby attenuating an output level of this band. The output levels of right and left channels are amplified or attenuated in the same direction.

Figure 1:
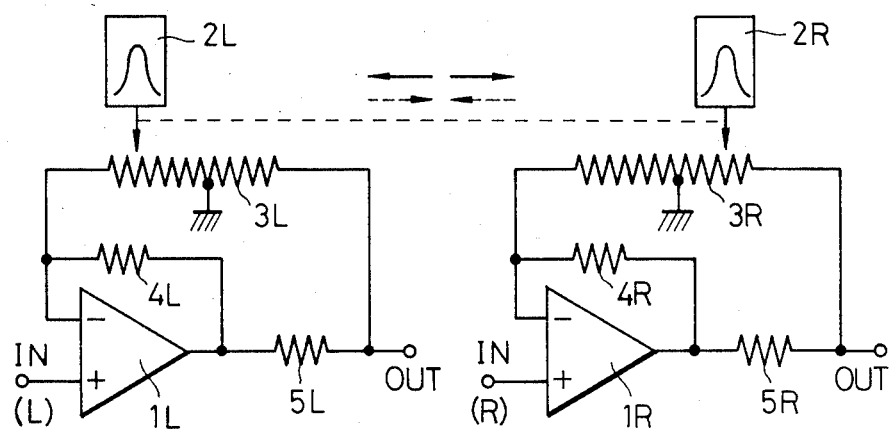
FIG. 1 is a basic circuit diagram of a graphic balancer according to one embodiment of the present invention.

FIG. 1 shows a basic circuit of a graphic balancer according to one embodiment of the present invention. The circuit shown in FIG. 1 is substantially the same as that of the graphic equalizer shown in FIG. 4 except that the movable terminals of the volume controls 3L and 3R in the left and right channels are synchronously moved in opposite directions. More specifically, when the volume control 3L in the left channel is moved to the left to increase the output gain, the movable terminal of the volume 3R in the right channel is moved to the right, thereby decreasing the output level. In this case, a musical instrument having its root near $f_0$ of the resonators 2L and 2R is moved to the left channel in terms of acoustic image. This also applies to the case of an operation in the opposite direction.

Figure 2:
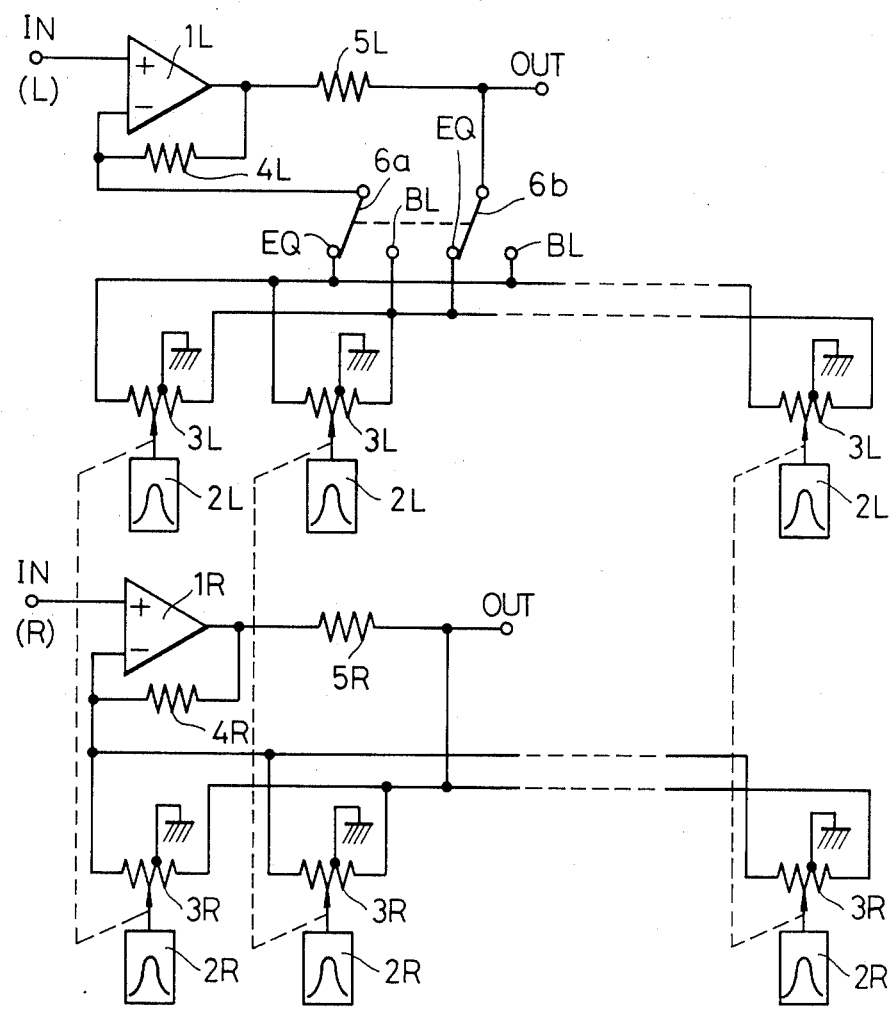
FIG. 2 is a circuit diagram according to another embodiment of the present invention in which a graphic equalizer and a graphic balancer employs a common circuit and is switched over to use.

FIG. 2 shows another embodiment wherein a graphic equalizer and a graphic balancer employs a common circuit to be switched over for use. Each channel is arranged such that the basic circuits shown in FIG. 1 are connected in parallel by the number of divided bands. In one channel (the left channel in FIG. 2), both terminals of each volume 3L connected in prallel are connected between the negative feedback input terminal of the operational amplifier 1L and one terminal of the output resistor 5L through interlinked switches 6a and 6b so as to be inversely (interchangeably) connected.

When the switches 6a and 6b are switched to the side of an equalizer EQ, the volume controls 3L and 3R in the left and right channels are moved in the same direction, thereby simultaneously controlling increase or decrease of the output levels of the right and left channels. When the switches 6a and 6b are switched to the side of a balancer BL, the volume controls 3L and 3R are moved in the opposite directions to increase the output level of one channel and decrease that of the other at each band, thereby synchronously performing this balancing operation.

Figure 3:
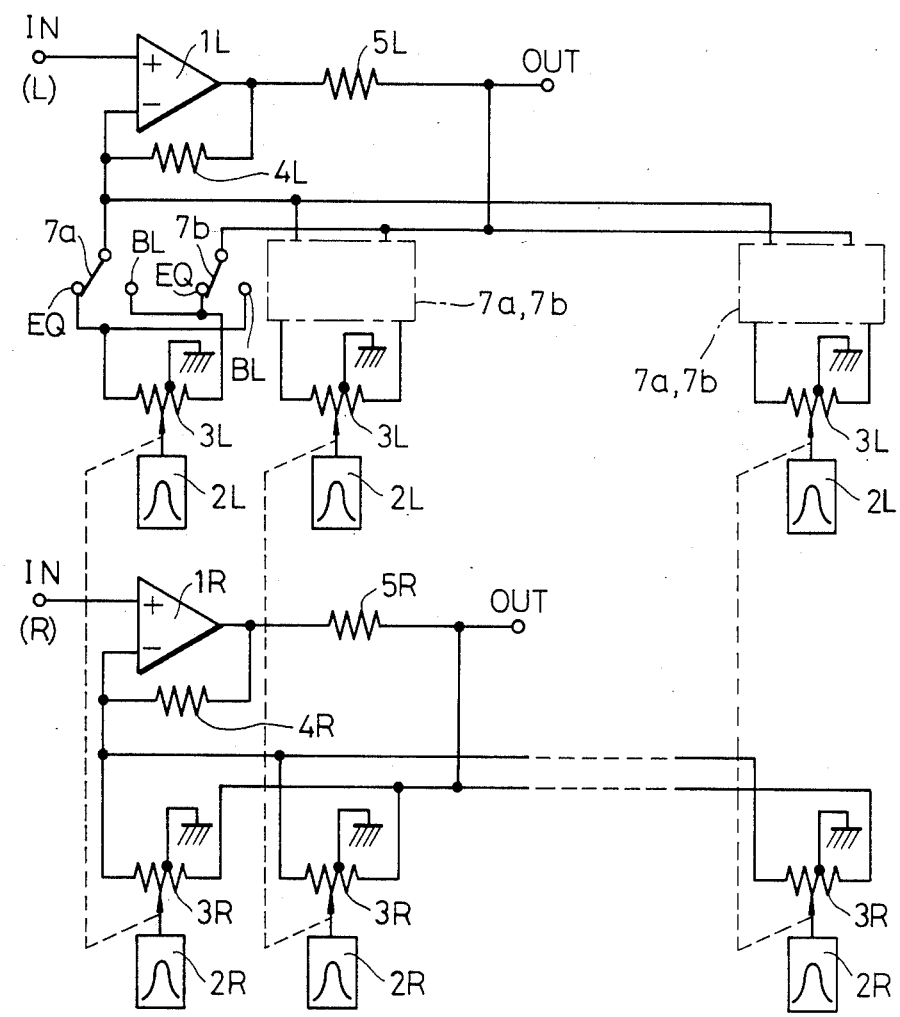
FIG. 3 is a circuit diagram according to still another embodiment of the present invention in which a graphic equalizer and a graphic balancer are switched in individual bands.

FIG. 3 shows still another embodiment wherein the equalizer and the balancer can be switched over in each band. More specifically, there is provided switches 7a and 7b for inverting both terminals of each volume 3L in the left channel and connecting them to the operational amplifier 1L in individual bands. Therefore, an equalizer function and a balancer function can be selected in any band.

Note that in the above embodiments, a balanced (or an unbalanced) condition is displayed as a graph (a compensation curve) along the frequency axis by the position of control knobs or by a display means. Effect of the Invention As has been described above, according to the present invention, there is provided a means for balancing levels of the right and left channels in each of a plurality of divided bands, so that the position of a sound source having its root in at a specific band can be freely moved with a good operability.

What is claimed is:

1. A graphic balancer comprising;
   left and right operational amplifiers, each having an input terminal, an output terminal and a feedback terminal,
   a first volume control having a movable terminal, two end terminals and a center tap, said two end terminals being connected between the feedback and output terminals of said left channel operational amplifier with said tap being connected to a reference point,
   a second volume control having a movable terminal, two end terminals and a center tap, said end terminals being connected between the feedback and output terminals of said right channel operational amplifier, with said tap being connected to said reference point,
   first and second resonators respectively connected between the movable terminals of said first and second volume controls and said reference point, and means for ganging together said movable terminals of said first and second volume controls so that when one channel's movable terminal is advanced towards its corresponding feedback terminal, the other channel's movable terminal is synchronously advanced toward its corresponding output terminal, and said first and second volume controls can be commonly used for and switched between a graphic equalizer and a graphic balancer.

2. A graphic balancer comprising;
   left and right operational amplifiers, each having an input terminal, an output terminal and a feedback terminal,
   a first volume control having a movable terminal, two end terminals and a center tap, said two end terminals being connected between the feedback and output terminals of said left channel operational amplifier with said tap being connected to a reference point,
   a second volume control having a movable terminal, two end terminals and a center tap, said end terminals being connected between the feedback and output terminals of said right channel operational amplifier, with said tap being connected to said reference point,
   first and second resonators respectively connected between the movable terminals of said first and second volume controls and said reference point, and means for ganging together said movable terminals of said first and second volume controls so that when one channel's movable terminal is advanced toward its corresponding feedback terminal, the other channel's movable terminal is synchronously advanced toward its corresponding output terminal, and switches for inversely connecting both end terminals of one of said volume controls for the right or left channels to the output terminal and the feedback terminal of said right or left operational amplifiers.

* * * * *